US008938371B2

(12) United States Patent
Hudetz

(10) Patent No.: US 8,938,371 B2
(45) Date of Patent: Jan. 20, 2015

(54) METHOD FOR GENERATING THREE DIMENSIONAL RIBBON CABLE OBJECTS IN COMPUTER AIDED DESIGN DRAWINGS

(75) Inventor: George Hudetz, Lake Oswego, OR (US)

(73) Assignee: Autodesk, Inc., San Rafael, CA (US)

( * ) Notice: Subject to any disclaimer, the term of this patent is extended or adjusted under 35 U.S.C. 154(b) by 2135 days.

(21) Appl. No.: 11/835,140

(22) Filed: Aug. 7, 2007

(65) Prior Publication Data

US 2009/0040223 A1     Feb. 12, 2009

(51) Int. Cl.
*G06F 17/50* (2006.01)
*G06T 17/10* (2006.01)
*G06T 19/20* (2011.01)

(52) U.S. Cl.
CPC ............. *G06T 17/10* (2013.01); *G06T 19/20* (2013.01); *G06T 17/5086* (2013.01); *G06T 2219/2021* (2013.01)
USPC .................................................... 703/1

(58) Field of Classification Search
USPC .................................................... 703/1
See application file for complete search history.

(56) References Cited

U.S. PATENT DOCUMENTS

| | | | |
|---|---|---|---|
| 5,740,341 A * | 4/1998 | Oota et al. ............... | 345/420 |
| 5,987,458 A * | 11/1999 | Anderson et al. ............... | 1/1 |
| 6,457,165 B1 * | 9/2002 | Ishikawa et al. ............... | 716/12 |
| 6,504,841 B1 | 1/2003 | Larson et al. | |
| 7,200,537 B2 * | 4/2007 | Ozaki ............... | 703/7 |
| 2007/0064016 A1 | 3/2007 | Hillerin et al. | |

OTHER PUBLICATIONS

Yang et al., Sketch-based Modeling of Parmeterized Objects, Jul. 2005, University of British Columbia, pp. 1-10.*
Gardiner, G., "Inventor 2008 Countdown #6 (Ribbon Cable)", Manufacturing Community Online, Autodesk, Mar. 12, 2007, pp. 1-2.
International Search Report. Oct. 22, 2008.

* cited by examiner

*Primary Examiner* — Omar Fernandez Rivas
*Assistant Examiner* — Bernard E Cothran
(74) *Attorney, Agent, or Firm* — Patterson & Sheridan, LLP

(57) ABSTRACT

A method for generating a three-dimensional representation of a ribbon cable in a computer-aided design drawing is disclosed. In one embodiment, a user may create a three-dimensional ribbon cable object with an arbitrary shape and an arbitrary number of fold or twists. A user creates or specifies a ribbon cable template incorporating several attributes and a computer aided design application may be configured to generate a three-dimensional ribbon cable object from the template and displays the representation of the three-dimensional ribbon cable object in the computer-aided design drawing. Further, once generated, the ribbon cable object may be flattened to a two-dimensional surface, identifying the overall length of the ribbon cable and the location of any folds.

21 Claims, 13 Drawing Sheets

METHOD FOR GENERATING THREE DIMENSIONAL RIBBON CABLE OBJECTS IN COMPUTER AIDED DESIGN DRAWINGS

BACKGROUND OF THE INVENTION

1. Field of the Invention

The present invention generally relates to computer software. More specifically, the present invention relates to a computer aided design (CAD) application configured to generate three-dimensional (3D) ribbon cable objects in a CAD drawing.

2. Description of the Related Art

The term computer-aided design (CAD) generally refers to a broad variety of computer-based tools used by architects, engineers, and other construction and design professionals. CAD applications may be used to construct computer models representing virtually any real-world construct. Commonly, CAD applications are used to compose computer models and drawings related to computer hardware. For example, a CAD application may be used to compose a 3D model of the hardware inside a personal computer (PC) or a laptop computer. Once composed, these CAD models are often used to generate a variety of two-dimensional (2D) and 3D views such as plan, profile, section, and elevation views. Additionally, such models may be used to generate, assembly, engineering, and other documentation related to the hardware inside the PC or laptop. Increasingly, CAD models are used to generate and display realistic 3D renderings of an object being modeled.

A common feature of CAD drawings of computer hardware is a ribbon cable. In a 3D drawing, ribbon cables are often represented using a set of hand-drawn lines to represent the likely path for the ribbon cable. As is the case with other modeled members, it is useful to have a realistic visual representation to understand the interaction of the ribbon cable with other elements. Further, it is useful to predict the length of ribbon cable needed for purposes of a parts list or bill of materials. It is also useful to know where the ribbon cable should be folded for manufacturing purposes.

Ribbon cable has special properties which make it somewhat more complex than typical modeled solids. The modeled ribbon cable must bend, fold, and twist just like a real ribbon cable would.

Ribbon cables can take on many configurations. The most basic ribbon cable has a connector at each end. Another type of ribbon cable has connectors along the length of the cable. Sometimes, a twist is introduced in a sub-section of the cable. Other configurations include splitting ends of the cable into multiple connectors, cutting sub-sections of the cable, attaching no connector (i.e., no electrical connectivity), as well as stripping individual wires and connecting them on an individual basis.

Creating realistic 3D renderings of a ribbon cable has proven to be challenging. Currently, the most common approach to modeling a 3D ribbon cable in a CAD drawing is to sweep a shape along a path. This technique requires a user to create a set of curves to approximate the path of the ribbon cable when composing a drawing. One drawback to this approach is that it often requires a great deal of time because the user has to draw each segment of the path individually. Moreover, if the user desires to modify the path of the ribbon cable (i.e., when the placement of other hardware elements has changed), then modifications must be made to the path of the ribbon cable. This becomes tedious, error prone, and inaccurate. Importantly, this modeling technique provides no way to accurately model folds, bends, or twists in the ribbon cable.

Another current approach to modeling a 3D ribbon cable is to create a thin rectangular shape and extrude the ribbon cable through that shape. This technique has many of the same drawbacks. Users must manually create the path for the ribbon cable and modifications are laborious. Likewise, this technique provides no way to accurately model folds, bends, or twists.

Accordingly, there remains the need in the art for a technique for generating a 3D ribbon cable in a CAD drawing that does not rely on the user having to manually compose each element of the desired 3D ribbon cable, and that allows users to more easily modify aspects of the 3D ribbon cable objects once generated.

SUMMARY OF THE INVENTION

One embodiment of the invention provides a method for generating a representation of 3D ribbon cable object in a computer aided CAD model. The method generally includes receiving a selection of a ribbon cable template and a first connector and second connector present in the CAD model. The template specifies a set of attributes for the 3D ribbon cable object to be generated. The method also includes determining a path for the 3D ribbon cable object to be generated that links the first and second connector and generating the 3D ribbon cable object based on the ribbon cable template, the first and second connectors, and the path. Once the 3D ribbon cable object is generated, it may be placed in the in the CAD model and associated with the first and second connector.

In a particular embodiment, the method may include receiving a modification to one of the connectors present in the CAD model, and in response, updating the 3D ribbon cable object to reflect the modification of the first or second connector. Also, a preview of the 3D ribbon cable object may be displayed prior to generating the 3D, and users may interact with the CAD application to modify the path. For example, a user may specify a single-fold, a double-fold, or a twist to apply to the ribbon cable or specify a point within the CAD model through which the path of the 3D ribbon cable object should intersect. Additionally, in a particular embodiment, a two-dimensional (2D) template of the 3D ribbon cable object may be generated. The 2D template may provide a dimensionally accurate representation of the 3D ribbon cable object that also specifies a location of any folds defined for the 3D ribbon cable object.

Thus, advantageously, embodiments of the invention allow users to interact with a CAD application to model real-world ribbon cables in CAD drawing, where the cables include single- and double-folds as well as rotations a desired point along the length of the ribbon cable object. In this fashion, embodiments of the invention allow users to easily represent many different ribbon cable geometries in a CAD drawing. Further, once generated, the ribbon cable object may be flattened to a 2D surface, identifying the overall length of the ribbon cable and the location of the folds. The 2D representation of the ribbon cable is useful determining a parts list or bill of materials. It is also useful to know where the ribbon cable should be folded for manufacturing purposes.

DETAILED DESCRIPTION OF THE PREFERRED EMBODIMENTS

Embodiments of the invention provide a CAD application configured for the semi-automated generation of ribbon cables in a CAD model. In one embodiment, the CAD application may provide a ribbon cable generation tool that allows users to specify a variety of properties to use in generating a ribbon cable object. For example, a user may specify the number or type of different connectors, pitch of wires, height of the ribbon cable, width of the ribbon cable, gauge of the wires in the ribbon cable, color of the ribbon cable, and a color used to depict a primary connection. Thereafter, the user selects the connectors for the ribbon cable by selecting elements of an existing solid model assembly in the CAD model. For example, in a CAD model depicting computer hardware components, the user may select one connector on a motherboard and another on a hard drive. Importantly, this allows users to generate ribbon cables directly from the solid model assembly in the CAD model without having to rely on a manually created path for the ribbon cable and without having to manually extrude the ribbon cable in the model.

Once the ribbon cable properties and elements of the CAD model are specified, the ribbon cable generation tool may be configured to generate and insert a drawing element representing the ribbon cable into the CAD model. A user may then add both folds and twists to the ribbon cable, as necessary. Additionally, the CAD application may be configured to provide information such as a bill of materials or a folding pattern for use in manufacturing the actual ribbon cable represented in the CAD model. Further, if the solid model assembly is modified, the CAD application may be configured to update the ribbon cable representation, as necessary.

Figure 1:
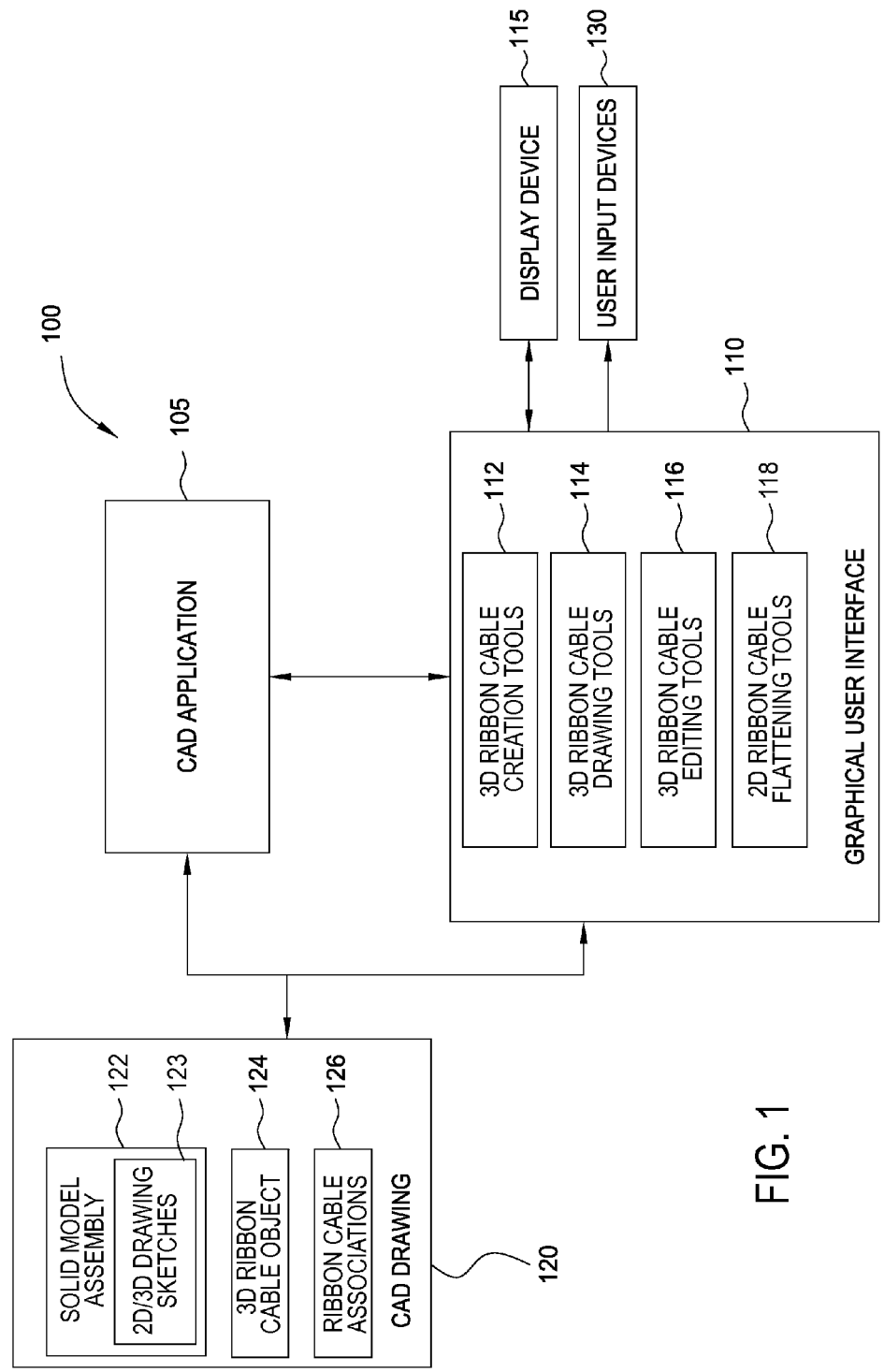
FIG. 1 is block diagram illustrating components of a CAD application used to generate ribbon cables for a CAD model, according to one embodiment of the invention.

FIG. 1 is a block diagram illustrating components of a system 100 used to generate ribbon cables for a solid model assembly in a CAD model, according to one embodiment of the invention. The components illustrated in system 100 may include computer software applications executing on existing computer systems, e.g., desktop computers, server computers, laptop computers, tablet computers, and the like. The software applications described herein, however, are not limited to any particular computing system and may be adapted to take advantage of new computing systems as they become available.

Additionally, the components illustrated in system 100 may be implemented as software applications that execute on a single computer system or on distributed systems communicating over computer networks such as local area networks or large, wide area networks, such as the Internet. For example, a graphical user interface 110 may include a software program executing on a client computer system at one physical location communicating with CAD application 105 at another physical location. Also, in one embodiment, CAD application 105 and graphical user interface 110 may be provided as an application program (or programs) stored on computer readable media such as a CD-ROM, DVD-ROM, flash memory module, or other tangible storage media.

As shown, the system 100 includes, without limitation, CAD application 105, graphical user interface 110, a CAD model/drawing 120, user input devices 130, and a display device 115. CAD application 105 may be configured to allow users interacting with GUI interface 110 to compose a CAD model 120. Accordingly, CAD application 105 and GUI interface 110 may include programmed routines or instructions allowing users to create, edit, load, and save CAD model 120. In one embodiment, the Autodesk® Inventor™ application program (and associated utilities) may be used. Those skilled in the art will recognize, however, that the components shown in FIG. 1 are simplified to highlight aspects of the present invention and that a typical CAD application 105 and GUI interface 110 may include a broad variety of additional tools and features used to compose and manage CAD model 120. Typically, user input devices 130 include a mouse pointing device and a keyboard, and display device 115 is a CRT or LCD display.

Illustratively, CAD model 120 includes a solid model assembly 122, 3D ribbon cable objects 124, and ribbon cable associations 126. Solid model assembly 122 provides a virtual three-dimensional representation of a real-world object. Ribbon cable objects 124 represent the ribbon cable used in the construction of an electronic hardware device, like a PC or laptop. Ribbon cable associations 126 specify which elements of solid model assembly 122 are related to a given ribbon cable object 124. In one embodiment, when associated elements of solid model assembly 122 are modified, CAD application 120 may be configured to update any associated 3D ribbon cable objects 124.

GUI 110 may provide an interface for users to compose and edit solid model assembly 122. For example, the Autodesk Inventor™ application provides a parametric modeling tool used by designers and engineers to produce and perfect new products. Whereas non-parametric CAD programs the dimensions are geometry-driven, a parametric modeling application allows the geometry of solid model assembly 122 to be dimension-driven. That is, if the dimensions are altered, the geometry automatically updates based on the new dimension. Using the Autodesk Inventor™ application, users compose solid model assembly 122 by first designing certain parts. The parts may then be combined to form solid model assembly 122. Parts are composed from one or more sketches 123. For example, in order to compose a solid model assembly of a simple cube, a user would first create a sketch having a square within a two-dimensional plane, and then use an extrude tool to create the three dimensional cube. The user could then add a shaft extending from cube by adding a sketch to the desired face of the cube, sketch a circle, and then extruding that circle to create a shaft. The cube and shaft may then be connected to other parts to form solid model assembly 122.

New assemblies can consist of both parts and other assemblies. The parametric modeling approach used by the Inventor™ application allows users to create three-dimensional models having virtually any desired level of detail. However, embodiments of the invention may be adapted for use with non-parametric modeling applications. Further, a variety of pre-modeled elements may be supplied with CAD application 105. In the context of the present invention, for example, pre-modeled elements may include the connectors used to affix a ribbon cable to connection points on elements representing various electrical devices (e.g., a ribbon cable connecting a computer motherboard and hard drive).

Graphical user interface 110 provides tools used in creating 3D ribbon cable object 124. As shown, graphical user interface 110 includes 3D ribbon cable creation tools 112, 3D ribbon cable drawing tools 114, 3D ribbon cable editing tools 116, and 2D ribbon cable flattening tools 118. Those skilled in the art will recognize, however, that the tools of GUI interface 110 shown in FIG. 1 are simplified to highlight aspects of the present invention and that a typical CAD application 105 and GUI interface 110 may include a broad variety of additional tools and features used to compose a CAD drawing 120.

In one embodiment, users may interact with GUI interface 110 and tools 112, 114, 116, and 118 to generate a 3D ribbon cable object. Data related to a 3D ribbon cable object may be stored in CAD drawing 120. 3D ribbon cable creation tools 112 may provide graphical user interface elements that allow a user to invoke a ribbon cable creation process performed by CAD application 105. The 3D ribbon cable creation tools 112 may allow the user to define physical, display, and meta properties of a 3D ribbon cable object to be generated and stored in CAD drawing 120, as well as to select the connectors associated with the ribbon cable object. Once CAD application 105 generates and stores 3D ribbon cable object 124 in CAD drawing 120, drawing tools 114 may allow a user to edit the appearance, path, or other properties of 3D ribbon cable object 124. For example, 3D ribbon cable drawing tools 114 may allow a user to select "pass-though" points for 3D ribbon cable object 124. A "pass-through" point is a location within the space modeled by CAD model 120 through which the path of 3D ribbon cable object 124 should intersect. Other actions that may be performed using 3D ribbon cable editing tools 116 include adding single- or double-folds and twists.

In one embodiment, 2D ribbon cable flattening tools 118 may be configured to generate a 2D representation of 3D ribbon cable object 124. The flattened 2D representation provides a template for manufacturing the actual 3D ribbon cable represented in CAD drawing 120. The flattened 2D representation may indicate the length and location of folds along the ribbon cable. Additionally, the calculated length of 3D ribbon cable object 124 may be useful for purposes of a bill of materials or estimating the cost of manufacturing a given ribbon cable, based on the calculated length.

Figure 2:
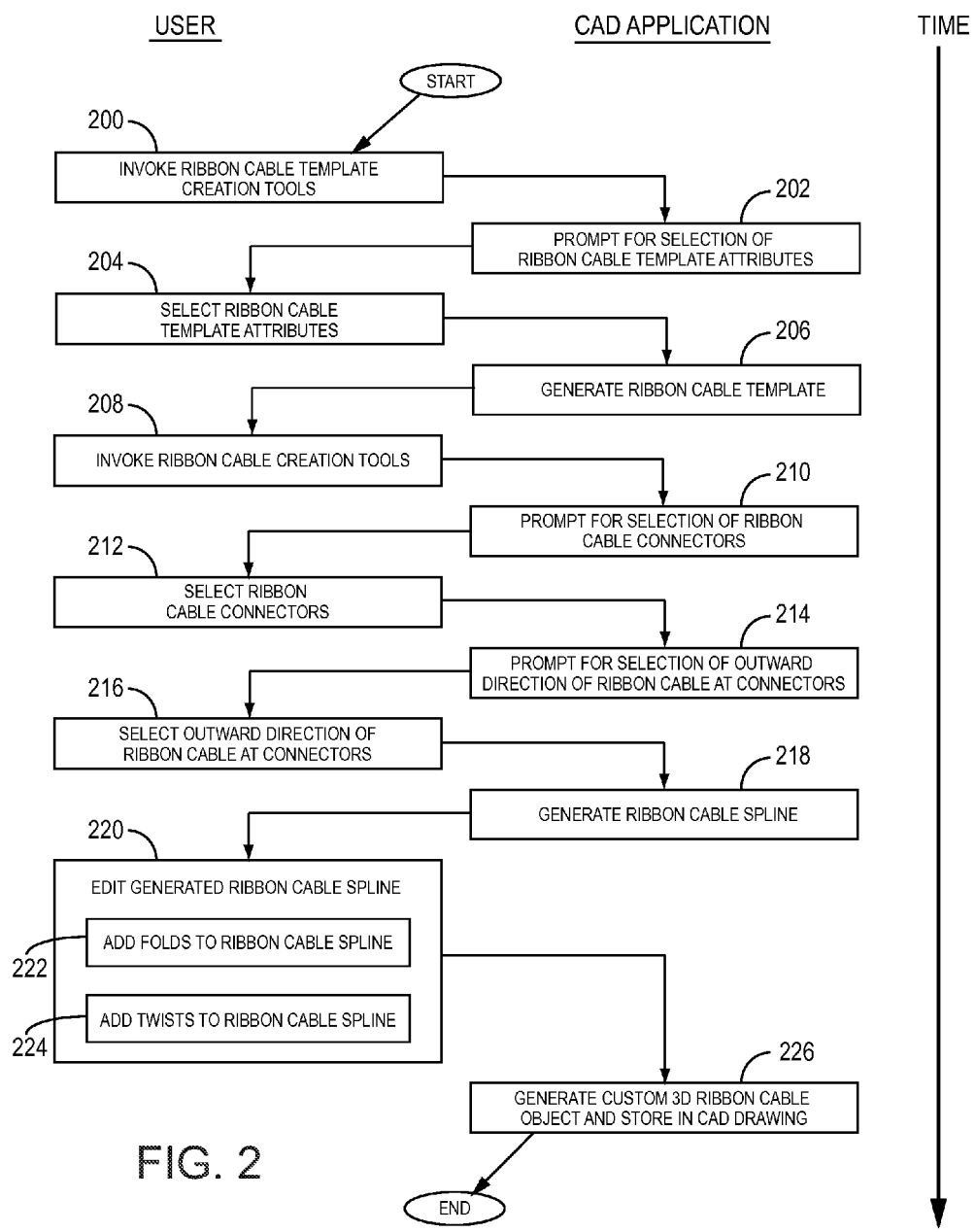
FIG. 2 is a flow chart of method steps for creating a ribbon cable object for a CAD model, according to one embodiment of the invention.

FIG. 2 is a flow chart of method steps for creating a ribbon cable object for a CAD model, according to one embodiment of the invention. Persons skilled in the art will understand that, even though the method is described in conjunction with the systems of FIG. 1, any system configured to perform the steps of the method illustrated in FIG. 2, in any order, is within the scope of the present invention. Additionally, in this example, actions typically performed by a user are shown on the left side of FIG. 2, and actions typically performed by CAD application 105 are shown on the right side of FIG. 2.

The method begins at step 200, where a user invokes a ribbon cable template creation tool provided by the CAD application. At step 202, the CAD application may prompt the user to specify the desired ribbon cable template attributes. The template may provide a collection include physical, display, and meta properties for the desired ribbon cable. In one embodiment, before a user creates an instance of a ribbon cable object in a CAD model, the user may define a set of attributes to associate with a particular ribbon cable template. The template may then be reused to create multiple instances of a ribbon cable object each having the set of attributes associated with the template. Alternatively, the CAD application may provide a pre-defined set of common ribbon cable templates (e.g., a 40 wire ATA cable used to connect a hard-disk to a connector present on the main board of a PC). At step 204, the user may select the desired attributes for a ribbon cable template. In response, at step 206, the CAD application may be configured to generate a ribbon cable template. In one embodiment, the template may be stored in a cable and harness library provided with the CAD application. Once created, users may create instances of a ribbon cable object in a CAD drawing using the ribbon cable template defined at steps 200-206. Often, users may desire to create multiple ribbon cables with the same physical, display, and meta properties. Persons skilled in the art will understand that this can be done efficiently by adding a new ribbon cable template to a cable and harness library. Each ribbon cable in the cable and harness library may have different physical, display, and meta properties.

The remaining steps of the method illustrated in FIG. 2 demonstrate a process of creating a ribbon cable object based on a ribbon cable template. The template may be defined as just described or may be selected from a set of predefined templates. At step 208, a user may invoke a ribbon cable creation tool. In response, at step 210, the CAD application may prompt the user to specify ribbon cable connectors. The ribbon cable connectors correspond to the endpoints within the CAD drawing for the ribbon cable to be generated. At step 212, the user selects the desired ribbon cable connectors from the available objects in the CAD drawing. In one embodiment, objects in the CAD drawing may be authored by the user to be identified by the CAD application as a connector element. For example, an object in a CAD drawing may be authored to be recognized as having the properties and appearance of a ribbon cable connector. In such a case, the CAD application may restrict a user to selecting only drawing elements that have been defined as a connector compatible with the ribbon cable template being used to generate a new ribbon cable.

Once the user has selected the desired connector elements in the CAD drawing, at step 214, the CAD application may prompt the user to specify an orientation of the ribbon cable for the connectors selected at step 212. For example, the ribbon cable may intersect with a given connecter at a particular point or exit from the connector at a particular orientation or direction. Also, the CAD application may prompt for a start pin location at each connector. At step 216, the user may select a desired outward direction of the ribbon cable at the connectors and the desired start pin location. At step 218, the CAD application may generate a spline to approximate the path of the ribbon cable. In one embodiment, the spline may be displayed to provide a preview of the path of a ribbon cable to be generated. At step 220, a user may edit the path to add folds (step 222) to the ribbon cable or to add twists or rotations to the ribbon cable (step 224). At step 226, the CAD application 105 may generate an instance of a 3D ribbon cable object and store the newly generated 3D ribbon cable object in the CAD drawing.

Figure 3:
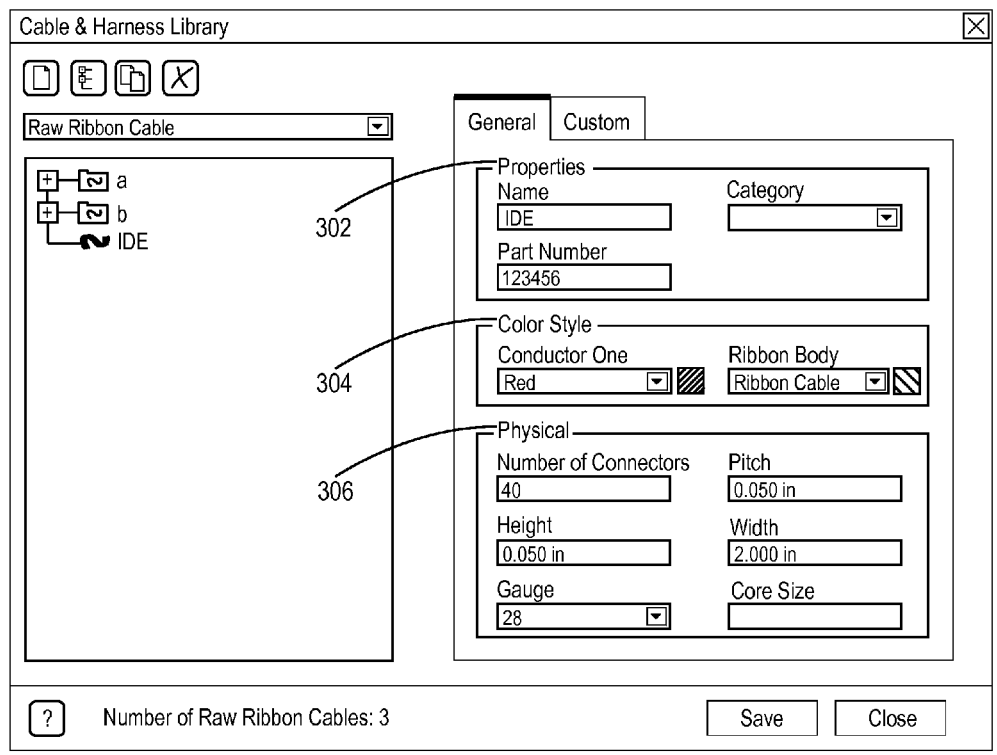
FIG. 3 illustrates an exemplary dialog box used to specify attributes of ribbon cable objects generated for a CAD model, according to one embodiment of the invention.

FIG. 3 illustrates a screenshot of a dialog box used to add a new ribbon cable template to a cable and harness library, according to one embodiment of the invention. As shown, a user may create a new ribbon cable template by specifying physical, display, and meta properties for the ribbon cable template. Property section 302 may allow a user to input a name for the ribbon cable template, place the template in a certain category of templates, or allocate a part number of a ribbon cable generated using the template. Color style section 304 may allow a user to select a color for the ribbon cable body as well as a color to be placed along one side of the ribbon cable so as to identify a "pin one connection" of the ribbon cable. Physical properties section 306 may allow users to select the number of connectors, pitch, height, width, gauge, or core size for a ribbon cable object generated using the selected template. Those skilled in the art will recognize, however, that the physical, display, and meta properties shown in FIG. 3 are simplified to highlight aspects of the present invention and that a template a ribbon cable template may include various combinations of these, or other, physical, display, and meta properties and features.

Figure 4A:
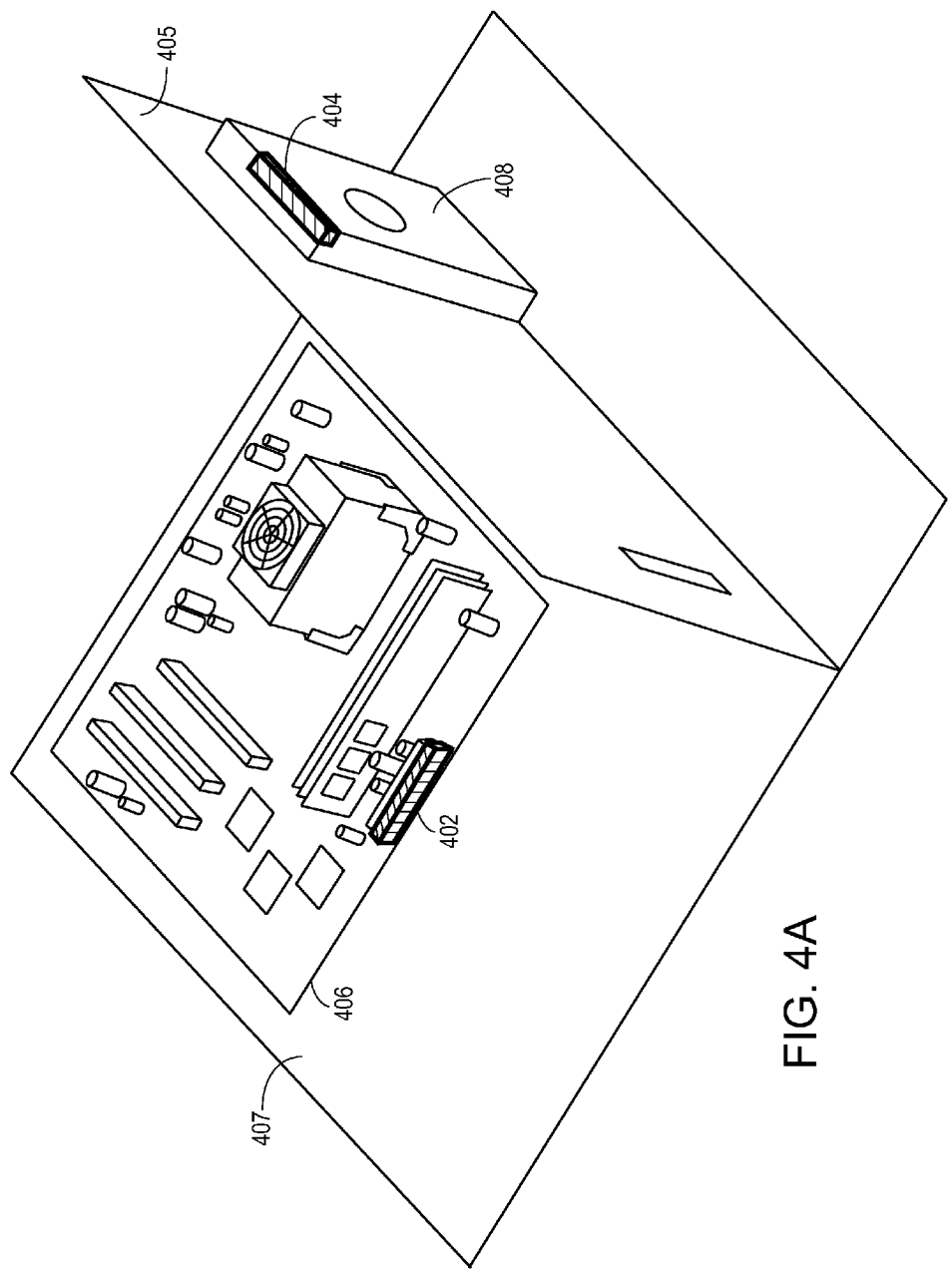
FIG. 4A illustrates a screen display of an exemplary graphical user interface showing the selection of two connectors between which a ribbon cable will be created, according to one embodiment of the invention.

FIG. 4A illustrates a screen display of an exemplary graphical user interface showing the selection of connectors 402 and 404 between which a ribbon cable object is to be created, according to one embodiment of the invention. In this example, FIG. 4A illustrates a CAD model representing hardware located inside a typical personal computer system. As shown, a motherboard 406 is mounted on a horizontally-oriented panel 407. A hard drive 408 is mounted on a vertically-oriented panel 405. A connector 402 is mounted on motherboard 406. Further, a connector 404 is mounted on hard drive 408. Connectors 402 and 404 have been selected by the user to indicate that connectors 402 and 404 to be the endpoint positions for a ribbon cable. Illustratively, connectors 402 and 404 are shown highlighted to indicate their selection as endpoints for a ribbon cable.

Figure 4B:
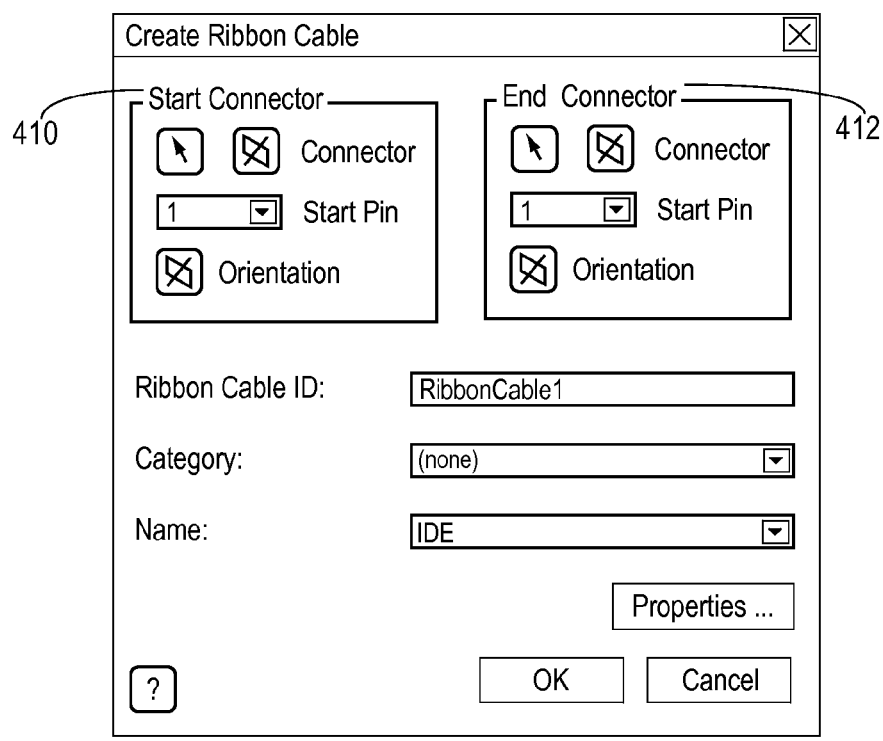
FIG. 4B illustrates an exemplary dialog box used to specify properties of ribbon cable objects generated for a CAD model with respect to connectors, according to one embodiment of the invention.

As stated, a user may invoke a ribbon cable creation process to generate an instance of a ribbon from a selected ribbon cable template. FIG. 4B illustrates an exemplary dialog box used to specify properties for a ribbon cable object generated to connect two ribbon cable connectors, according to one embodiment of the invention. A user may select which connector of connectors 402 and 404 of FIG. 4A to be the starting connector and which connector to be the ending connector. A user may also define connector properties 410 for the starting connector, including but not limited to an orientation or a start pin. For example, the orientation may specify that the ribbon cable exits from a particular side of the connector, or exits from that side at a particular angle. Similarly, a user may then define end properties 412 for the ending connector, including but not limited to an orientation or a start pin.

Figure 4C:
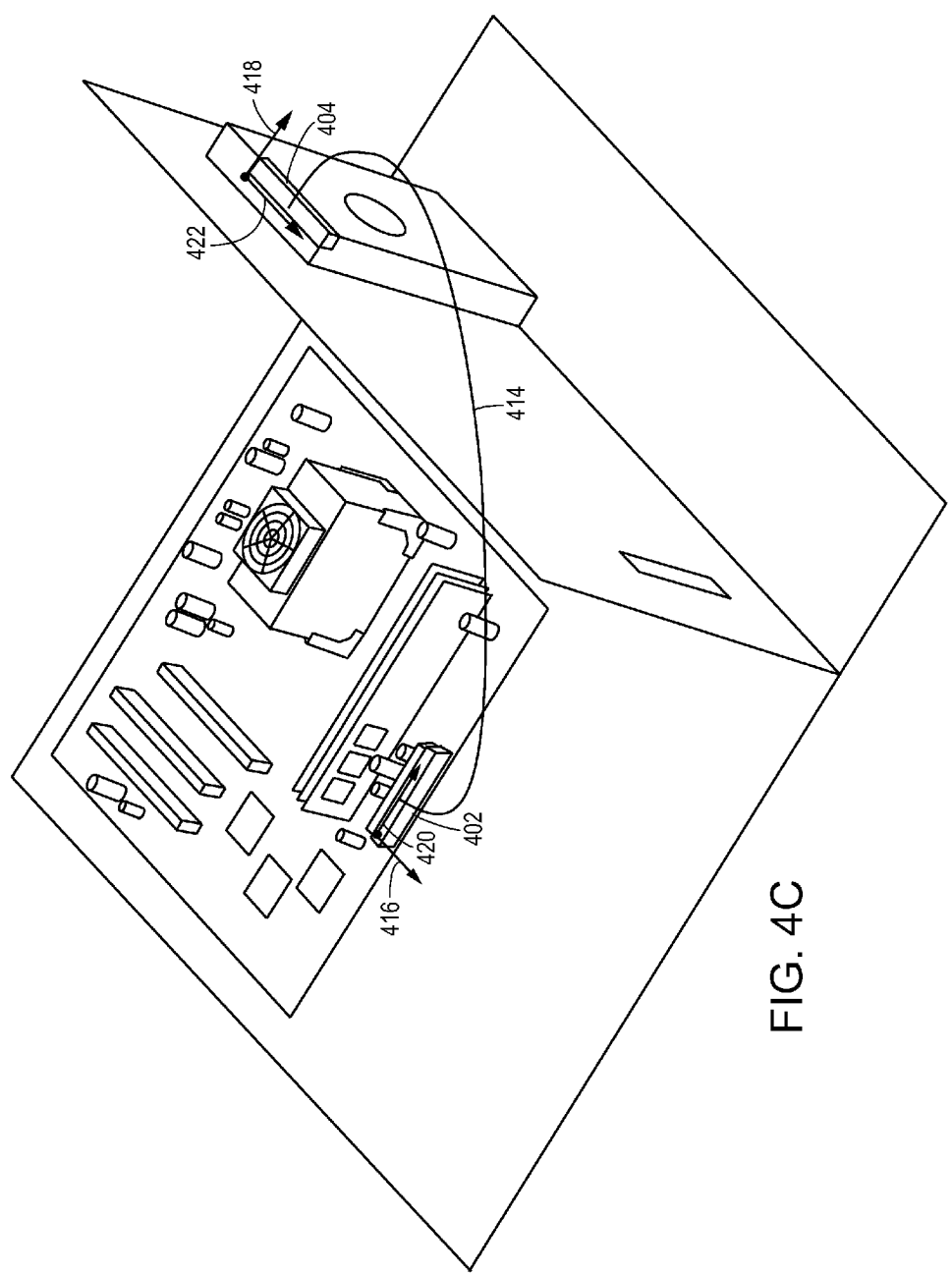
FIG. 4C illustrates a screen display of an exemplary graphical user interface showing a spline generated by a CAD application, according to one embodiment of the invention.

Once the user has selected the connectors for the ribbon cable and specified the desired orientation and start pins, the CAD application may be configured to generate a preview spline illustrating an initial path for a ribbon cable to connect the selected connectors. FIG. 4C illustrates a screen display of an exemplary graphical user interface showing a spline 414 generated by a CAD application, according to one embodiment of the invention. As shown, the orientation arrows 416 and 418 indicate the outward direction of the ribbon cable at each of the connectors 402 and 404. Also, start pin arrows 420 and 422 illustrate the start pin location and direction over which pin numbers ascend. Generally, users will use a start pin location at pin one on one side of the ribbon cable.

Figure 4D:
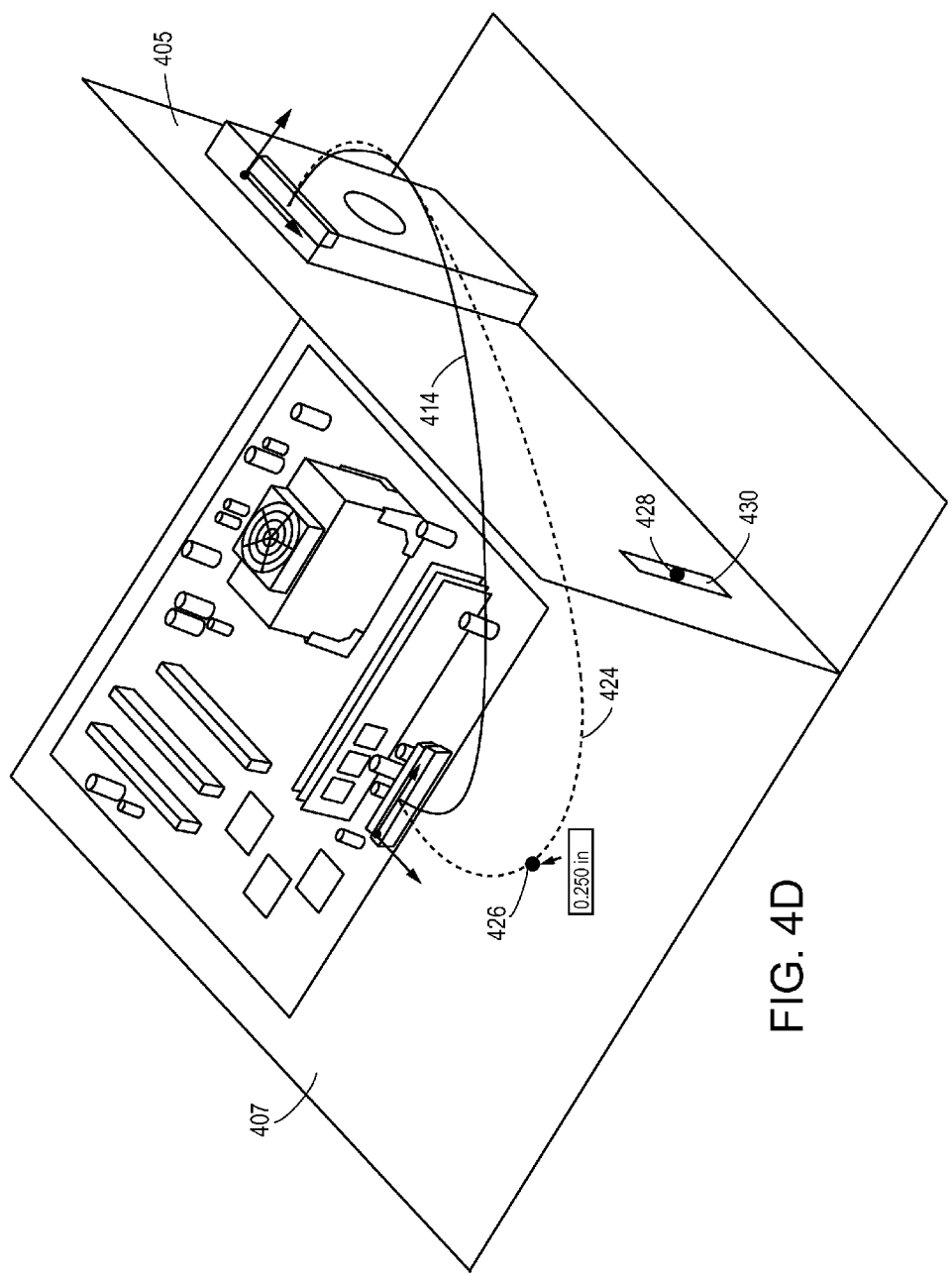
FIG. 4D illustrates a screen display of an exemplary graphical user interface showing a spline generated by a CAD application and a user-modified preview spline that approximates the path of the ribbon cable object, according to one embodiment of the invention.

In one embodiment, a user may edit spline 414 to modify the properties of the ribbon cable object ultimately generated for the CAD model. For example, FIG. 4D illustrates a screen display of an exemplary graphical user interface showing spline 414 generated by a CAD application and a user-modified preview spline 424 that approximates the path of the ribbon cable object after editing, according to one embodiment of the invention. Illustratively, a user has edited spline 414 by creating pass-through points 426 and 428. As shown in FIG. 4D, the user has specified a pass-through point 426 located 0.250 inches from the horizontally-oriented panel 407. Additionally, in FIG. 4D, there is an opening 430 in the vertically-oriented panel 405. The user has placed a second pass-through point 428 in the opening 430, so that the ribbon cable passes through opening 430.

Figure 4E:
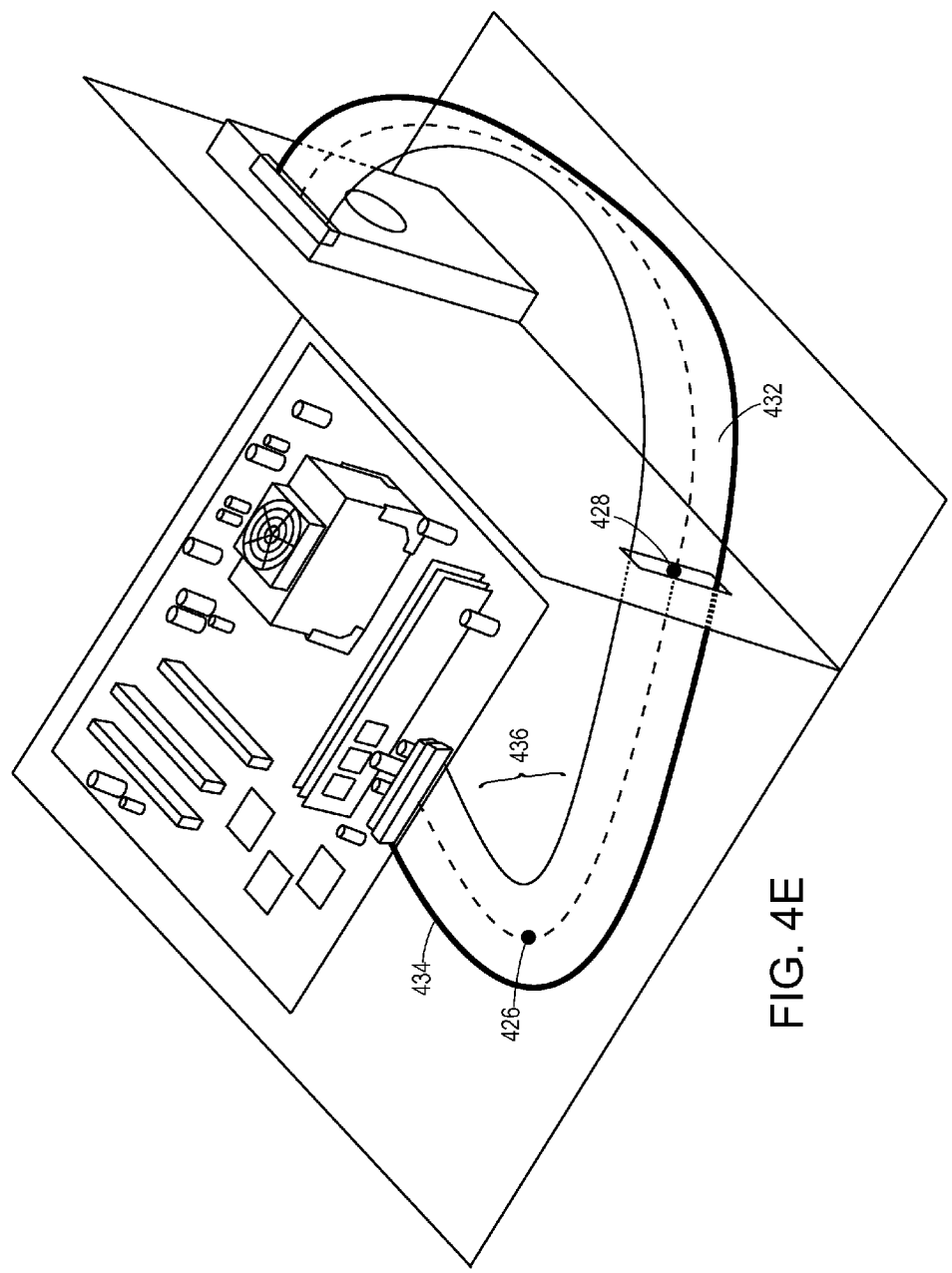
FIG. 4E illustrates a screen display of an exemplary graphical user interface showing a ribbon cable object generated by a CAD application, according to one embodiment of the invention.

Once any desired pass-through points are added, the CAD application may generate a 3D ribbon cable object. FIG. 4E illustrates a screen display of an exemplary graphical user interface showing a ribbon cable object generated by a CAD application, according to one embodiment of the invention. As shown, a ribbon cable object 432 passes through pass-through points 426 and 428. Further, it may be useful for the CAD application to display to the user the path of wire at pin number one. This can be illustrated by the boldface line that is intended to display the pin one connection 434 along the ribbon cable 432. As illustrated, there is a sharp curve 436 in the ribbon cable object 432. A ribbon cable in the real world would not be able to make such a sharp curve because of its inherent physically properties. In such a case, it is desired to create a fold in the ribbon cable. Creating folds in current CAD applications is difficult because a user had to manually create the path of the fold. As explained below, one aspect of the present invention provides a method for a user to add folds to a ribbon cable object in a CAD application to model more accurately real-world ribbon cables.

Figure 5:
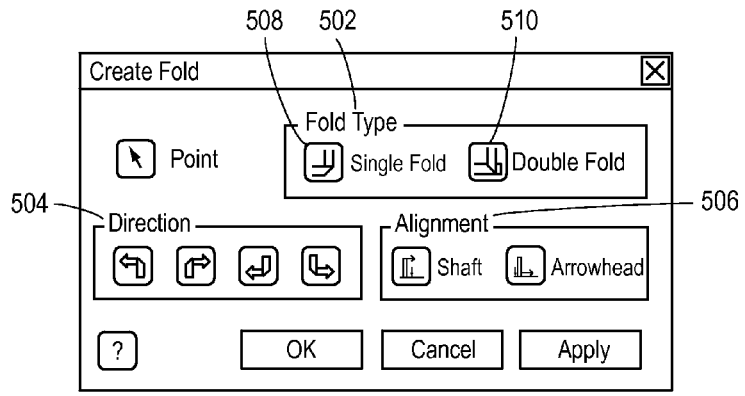
FIG. 5 illustrates an exemplary dialog box used to specify properties of folds in ribbon cable objects generated for a CAD model, according to one embodiment of the invention.

In one embodiment, a user may invoke a fold creation tool to add a fold to a previously generated ribbon cable object. FIG. 5 illustrates an exemplary dialog box used to specify properties of folds in ribbon cable objects generated for a CAD model, according to one embodiment of the invention. A user may select various properties of a fold, including but not limited to fold type 502, direction 504, or alignment 506. A single-fold option 508 generates a fold in which the ribbon cable is bent 90-degrees to form a right angle. A consequence of a single fold in a ribbon cable is that if a pin one connection was on the outside of the ribbon cable, then after the fold the pin one connection is translated to the inside of the connector.

If a user desires the pin one connection to remain oriented on the same side of the ribbon cable, then a user may invoke a double-fold option 510. A double fold is created with two subsequent folds. First, the ribbon cable is folded back onto itself. Second, the ribbon cable is bent 90-degrees to form a right angle. The double fold allows the ribbon cable to retain orientation of the pin one connection, at the expense of increasing the length of the ribbon. Examples of single- and double-folds follow in FIGS. 6A-6B.

Figure 6A:
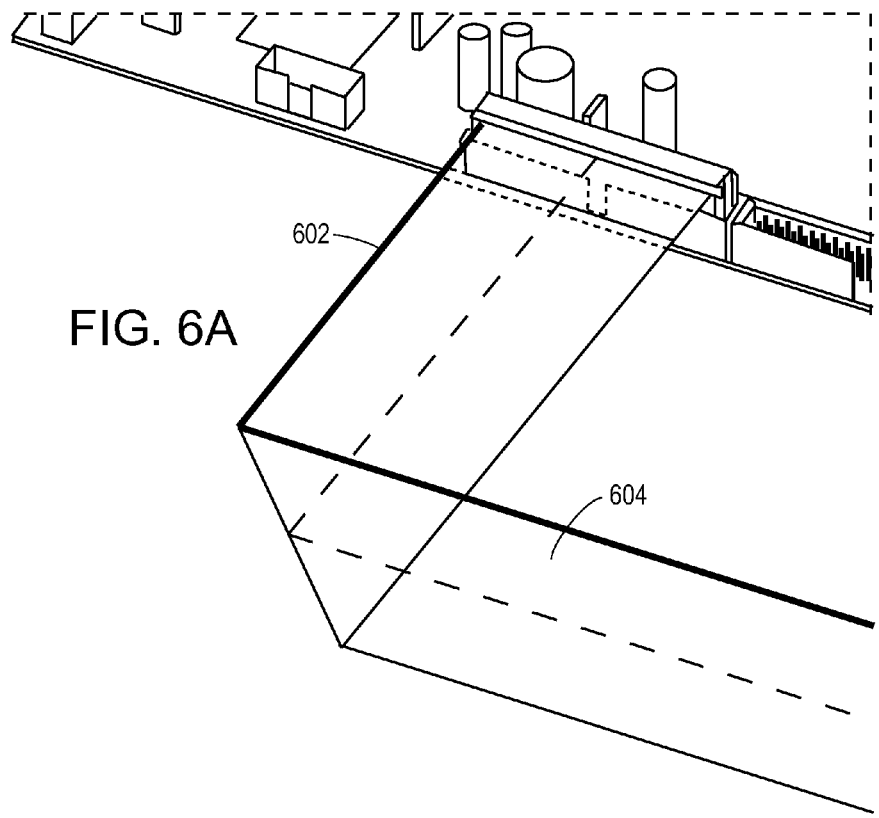
FIG. 6A illustrates a screen display of an exemplary graphical user interface showing a ribbon cable object generated by a CAD application incorporating a single fold, according to one embodiment of the invention.

FIG. 6A illustrates a screen display of an exemplary graphical user interface showing a ribbon cable object generated by a CAD application incorporating a single fold, according to one embodiment of the invention. As illustrated, the pin one connection 602 is located on outside of the ribbon cable 604 before the fold, but on the inside of the ribbon cable 604 after the fold.

Figure 6B:
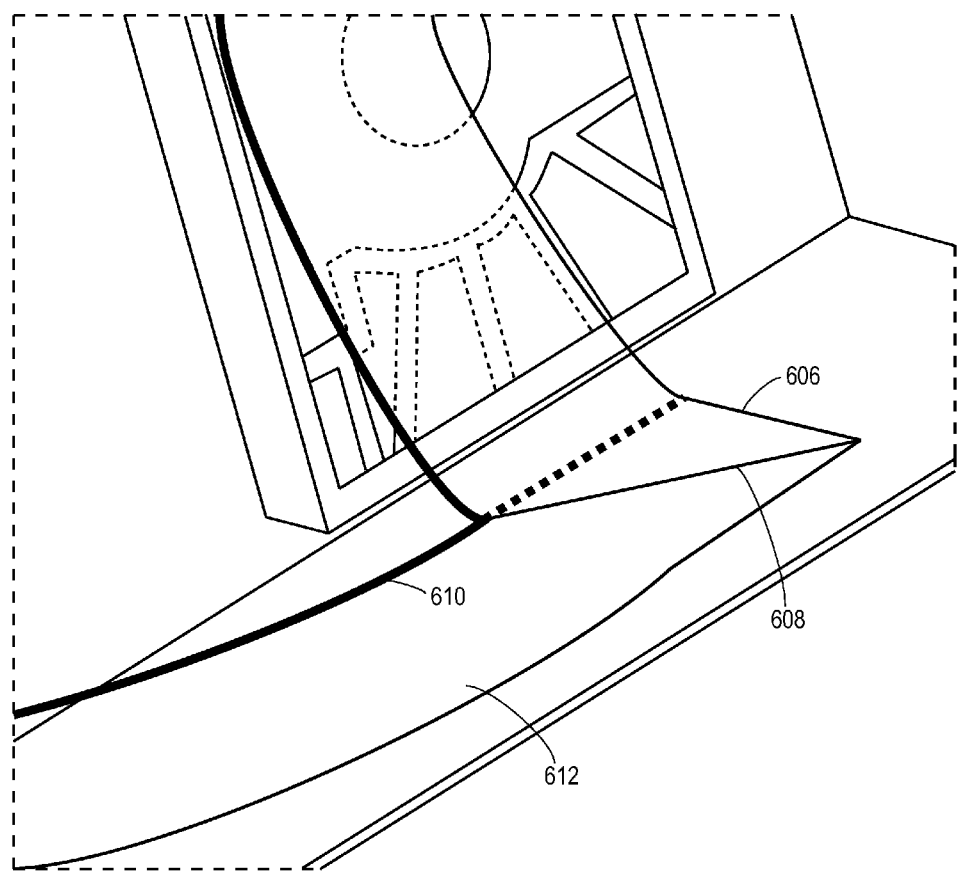
FIG. 6B illustrates a screen display of an exemplary graphical user interface showing a ribbon cable object generated by a CAD application incorporating a double fold, according to one embodiment of the invention.

FIG. 6B illustrates a screen display of an exemplary graphical user interface showing a ribbon cable object generated by a CAD application incorporating a double fold, according to one embodiment of the invention. The double fold shown in FIG. 6B is created using two subsequent folds. First, the ribbon cable is folded onto itself along fold-line 606. Second, a 90-degree fold is made along fold-line 608. As shown, the pin one connection 602 remains along the inside of the ribbon cable object 610 both before and after the fold.

Figure 7A:
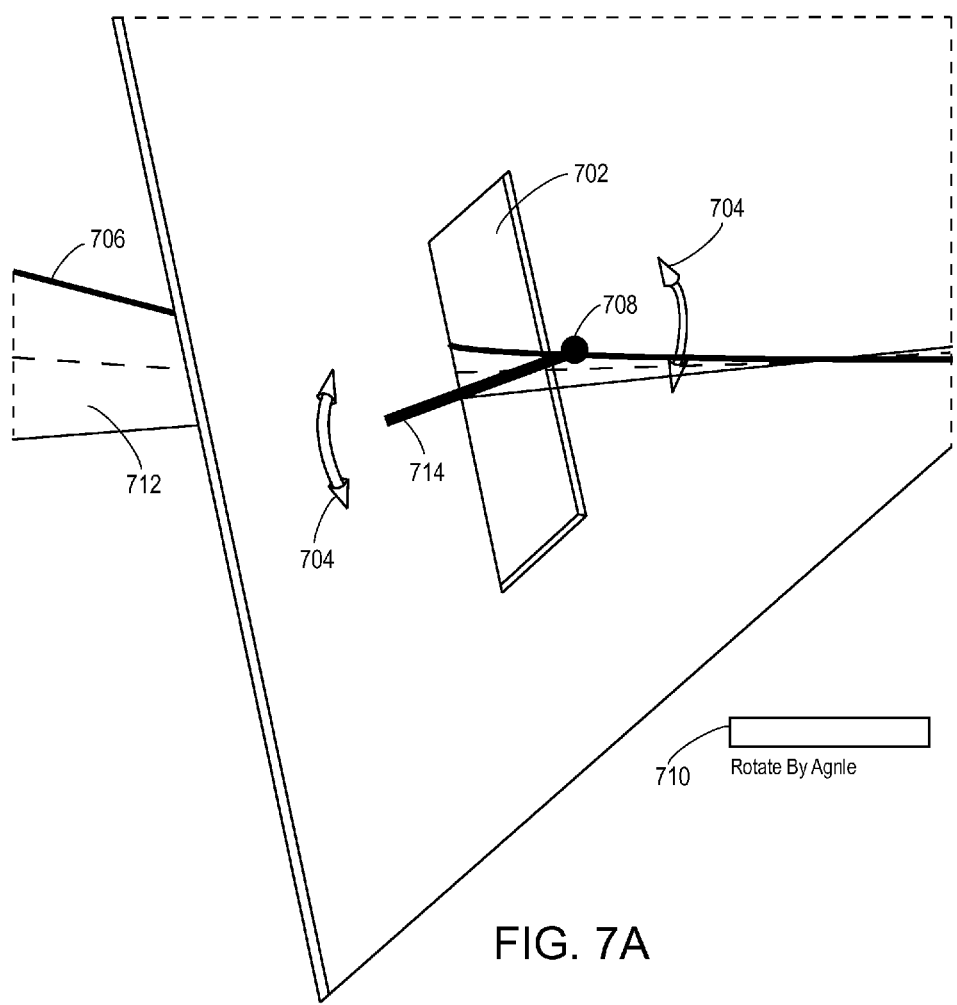
FIG. 7A illustrates a screen display of an exemplary graphical user interface showing a ribbon cable object generated by a CAD application as well as ribbon cable rotation tools, according to one embodiment of the invention.

FIG. 7A illustrates a screen display of an exemplary graphical user interface showing a ribbon cable object generated by a CAD application as well as ribbon cable rotation tools, according to one embodiment of the invention. As shown, the generated ribbon cable 712 does not properly pass through an opening 702. A user may use a mouse to click-and-drag rotation arrows 704 to orient the ribbon cable object 712 so that it properly passes through the opening 702. A rotation bar 714 may be helpful for a user to see where the cross-section of the ribbon cable object 712 is located in the CAD drawing. The pin one connection 706 is depicted along the rotation bar 714 by a circle 708. This may be helpful to a user when rotating a ribbon cable object so that the pin one connection is properly oriented. Alternatively, a rotate by angle dialog box 710 may allow a user to input the angle by which the ribbon cable object 712 is to be rotated.

Figure 7B:
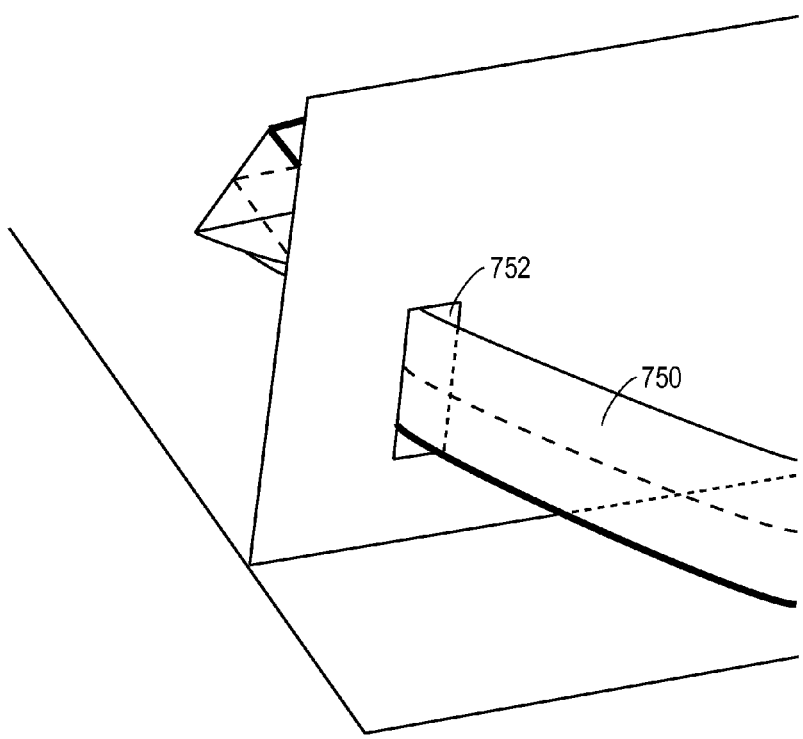
FIG. 7B illustrates a screen display of an exemplary graphical user interface showing a ribbon cable object generated by a CAD application that has been rotated to properly pass through an opening, according to one embodiment of the invention.

FIG. 7B illustrates a screen display of an exemplary graphical user interface showing a ribbon cable object 750 generated by a CAD application that has been rotated to property pass through an opening 752, according to one embodiment of the invention.

Figure 8:
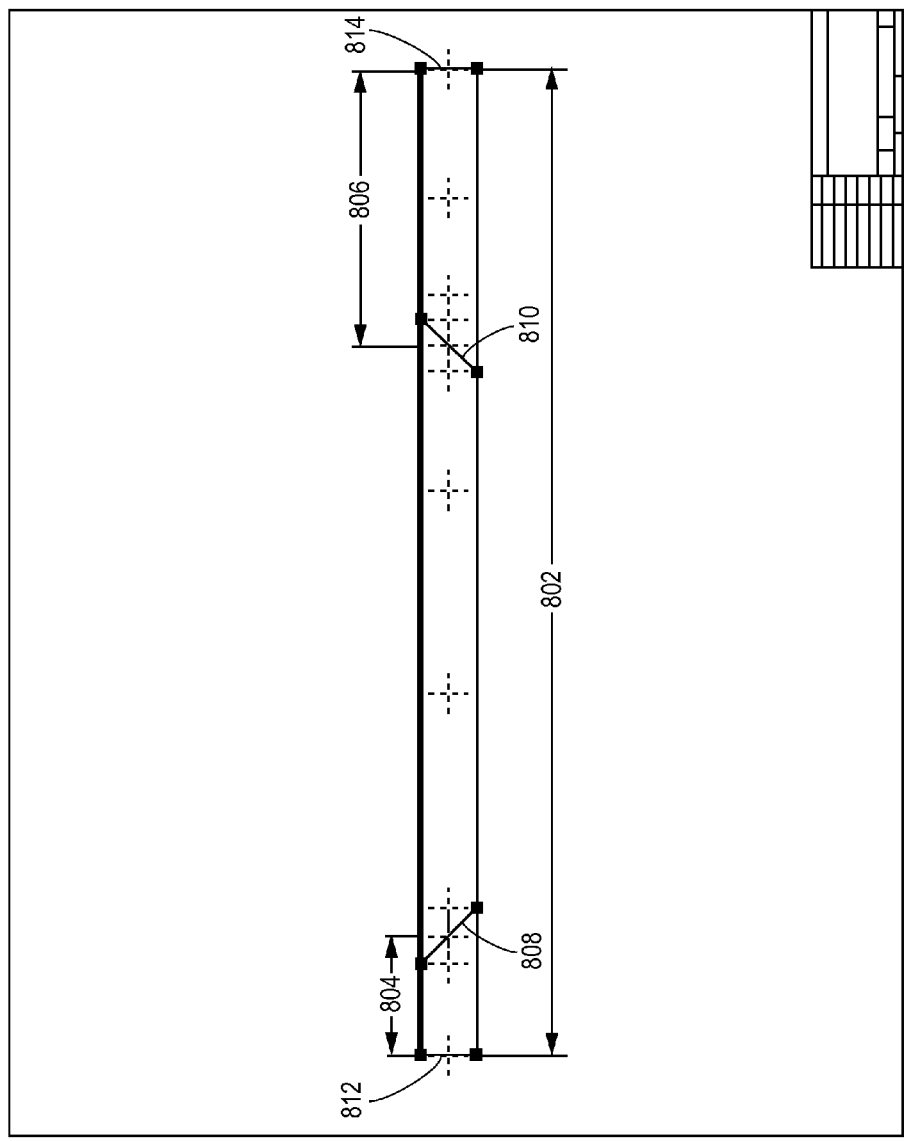
FIG. 8 illustrates a screen display of an exemplary graphical user interface showing a flattened ribbon cable generated by a CAD application, according to one embodiment of the invention.

After the user has added the desired folds and rotations to a ribbon cable object, it may be useful for a CAD application to generate a 2D flattened version of the ribbon cable object. FIG. 8 illustrates a screen display of an exemplary graphical user interface showing a flattened ribbon cable object generated by a CAD application, according to one embodiment of the invention. For example, it may be useful to determine the length of ribbon cable needed to for purposes of a parts list or bill of materials. It is also useful to know where the ribbon cable should be folded for manufacturing purposes. As illustrated in FIG. 8, a length 802 of the ribbon cable may be shown by the CAD application. Further, a CAD application may display the location of fold-lines 808 and 810 of the ribbon cable. The fold-lines 808 and 810 may be displayed such that a user may view the distance 804 and 806 from the center of the fold-lines 808 and 810 to the ends 812 and 814 of the ribbon cable.

As described, embodiments of the invention allow users to generate complex 3D ribbon cable objects from relatively simple inputs. For example, embodiments of the invention allow users to create a CAD drawing that includes ribbon cable objects passing through imaginary points, incorporating single- or double-folds, as well as twists in the ribbon cable object. Users provide a minimal set of inputs for the desired 3D ribbon cable object that include a selection of connectors and ribbon cable properties. From this information, the CAD application is configured to generate a 3D ribbon cable object. Once generated, the 3D ribbon cable object may be manipulated using a variety of user-selectable grips or other GUI interface tools. Further, a user may wish to flatten the 3D ribbon cable to a 2D surface so as to determine the length and location of the folds on the ribbon cable. Thus, embodiments of the invention simplify both the design process and work required to create and modify a 3D ribbon cable object included in a CAD drawing.

While the foregoing written description of the invention enables one of ordinary skill to make and use what is considered presently to be the best mode thereof, those of ordinary skill will understand and appreciate the existence of variations, combinations, and equivalents of the specific exemplary embodiment and method herein. The invention should therefore not be limited by the above described embodiment and method, but by all embodiments and methods within the scope and spirit of the invention as claimed.

What is claimed is:

1. A method for generating a representation of a three-dimensional (3D) ribbon cable object in a computer aided design (CAD) model, the method comprising:
   receiving a selection of a ribbon cable template, wherein the ribbon cable template specifies a set of attributes for the 3D ribbon cable object to be generated;
   receiving a selection of a first 3D connector object and a second 3D connector object present in the CAD model;
   determining a path for the 3D ribbon cable object to be generated, wherein the path links the first 3D connector object and the second 3D connector object;
   generating the 3D ribbon cable object based on the ribbon cable template, the first 3D connector object and the second 3D connector object, and the path;
   placing the 3D ribbon cable object in the CAD model; and
   associating the 3D ribbon cable object with the first 3D connector object and the second 3D connector object in the CAD model.

2. The method of claim 1, further comprising:
   receiving a modification to one of the first 3D connector object or the second 3D connector object present in the CAD model; and
   updating the 3D ribbon cable object to reflect the modification of the first 3D connector object or the second 3D connector object.

3. The method of claim 1, wherein the set of attributes specified by the 3D ribbon cable template include physical, display, or meta properties to assign to instances of 3D ribbon cable objects generated from the 3D ribbon cable template.

4. The method of claim 1, further comprising:
   displaying a preview of the 3D ribbon cable object; and
   receiving a selection of a modification to the path.

5. The method of claim 4, wherein the modification includes a single-fold, a double-fold, or a twist to be applied to the ribbon cable.

6. The method of claim 4, wherein the modification specifies a point within the CAD model which the path of the 3D ribbon cable object should intersect.

7. The method of claim 1, further comprising generating a two-dimensional (2D) template of the 3D ribbon cable object, wherein the 2D template provides a dimensionally accurate representation of the 3D ribbon cable object that specifies the locations of any folds defined for the 3D ribbon cable object.

8. A non-transitory computer-readable storage medium storing instructions for generating a truss object for a computer-aided design (CAD) model, including instructions for performing the steps of:
receiving a selection of a ribbon cable template; wherein the ribbon cable template specifies a set of attributes for the 3D ribbon cable object to be generated;
receiving a selection of a first 3D connector object and a second 3D connector object present in the CAD model;
determining a path for the 3D ribbon cable object to be generated, wherein the path links the first 3D connector object and the second 3D connector object;
generating the 3D ribbon cable object based on the ribbon cable template, the first 3D connector object and the second 3D connector object, and the path;
placing the 3D ribbon cable object in the CAD model; and
associating the 3D ribbon cable object with the first 3D connector object and the second 3D connector object in the CAD model.

9. The computer-readable storage medium of claim 8, wherein the instructions further comprise, instructions for:
receiving a modification to one of the first 3D connector object or the second 3D connector object present in the CAD model; and
updating the 3D ribbon cable object to reflect the modification of the first c3D connector object or the second 3D connector object.

10. The computer-readable storage medium of claim 8, wherein the set of attributes specified by the 3D ribbon cable template include physical, display, or meta properties to assign to instances of 3D ribbon cable objects generated from the 3D ribbon cable template.

11. The computer-readable storage medium of claim 8, wherein the instructions further comprise, instructions for:
displaying a preview of the 3D ribbon cable object; and
receiving a selection of a modification to the path.

12. The computer-readable storage medium of claim 11, wherein the modification includes a single-fold, a double-fold, or a twist to be applied to the ribbon cable.

13. The computer-readable storage medium of claim 11, wherein the modification specifies a point within the CAD model which the path of the 3D ribbon cable object should intersect.

14. The computer-readable storage medium of claim 8, wherein the instructions further comprise, instructions for generating a two-dimensional (2D) template of the 3D ribbon cable object, wherein the 2D template provides a dimensionally accurate representation of the 3D ribbon cable object that specifies the locations of any folds defined for the 3D ribbon cable object.

15. A method for generating a representation of a three-dimensional (3D) ribbon cable object in a computer aided design (CAD) model, the method comprising:
selecting a ribbon cable template, wherein the template specifies a set of attributes for the 3D ribbon cable object to be generated;
selecting a first 3D connector object and a second 3D connector object present in the CAD model; and
invoking a 3D ribbon cable object creation tool provided by a CAD application, wherein the 3D ribbon cable object creation tool is configured to:
determine a path for the 3D ribbon cable object to be generated, wherein the path links the first 3D connector object and the second 3D connector object,
generate the 3D ribbon cable object based on the ribbon cable template, the first 3D connector object and the second 3D connector object, and the path,
place the 3D ribbon cable object in the CAD model, and
associate the 3D ribbon cable object with the first 3D connector object and the second 3D connector object in the CAD model.

16. The method of claim 15, wherein the 3D ribbon cable object creation tool is further configured to:
modify one of the first 3D connector object or the second 3D connector object present in the CAD model; and
update the 3D ribbon cable object to reflect the modification of the first 3D connector object of the second 3D connector object.

17. The method of claim 15, wherein the set of attributes specified by the 3D ribbon cable template include physical, display, or meta properties to assign to instances of 3D ribbon cable objects generated from the 3D ribbon cable template.

18. The method of claim 15, wherein the 3D ribbon cable object creation tool is further configured to:
display a preview of the 3D ribbon cable object; and
receive a selection of a modification to the path.

19. The method of claim 18, wherein the modification includes a single-fold, a double-fold, or a twist to be applied to the ribbon cable.

20. The method of claim 18, wherein the modification specifies a point within the CAD model which the path of the 3D ribbon cable object should intersect.

21. The method of claim 15, wherein the 3D ribbon cable object creation tool is further configured to generate a two-dimensional (2D) template of the 3D ribbon cable object, wherein the 2D template provides a dimensionally accurate representation of the 3D ribbon cable object that specifies the locations of any folds defined for the 3D ribbon cable object.

* * * * *